(12) United States Patent
Konno et al.

(10) Patent No.: US 10,906,270 B2
(45) Date of Patent: Feb. 2, 2021

(54) MULTILAYER STRUCTURE AND MACHINE COMPONENT HAVING MULTILAYER STRUCTURE

(71) Applicant: MITSUBISHI HEAVY INDUSTRIES COMPRESSOR CORPORATION, Tokyo (JP)

(72) Inventors: Yuya Konno, Tokyo (JP); Toyoaki Yasui, Tokyo (JP); Masaki Kawano, Tokyo (JP)

(73) Assignee: MITSUBISHI HEAVY INDUSTRIES COMPRESSOR CORPORATION, Tokyo (JP)

( * ) Notice: Subject to any disclaimer, the term of this patent is extended or adjusted under 35 U.S.C. 154(b) by 177 days.

(21) Appl. No.: 16/097,945

(22) PCT Filed: Aug. 23, 2017

(86) PCT No.: PCT/JP2017/030096
§ 371 (c)(1),
(2) Date: Oct. 31, 2018

(87) PCT Pub. No.: WO2018/038151
PCT Pub. Date: Mar. 1, 2018

(65) Prior Publication Data
US 2019/0143644 A1    May 16, 2019

(30) Foreign Application Priority Data

Aug. 26, 2016  (JP) ................................. 2016-165291

(51) Int. Cl.
*B32B 15/04*     (2006.01)
*F01D 5/28*      (2006.01)
(Continued)

(52) U.S. Cl.
CPC ................ *B32B 15/04* (2013.01); *C23C 8/38* (2013.01); *C23C 8/80* (2013.01); *C23C 16/02* (2013.01);
(Continued)

(58) Field of Classification Search
CPC . B32B 15/04; C23C 16/27; F01D 5/28; F04C 15/00
(Continued)

(56) References Cited

U.S. PATENT DOCUMENTS

2007/0254187 A1* 11/2007 Yamamoto ............ C23C 14/027
428/698
2009/0246243 A1* 10/2009 Martinu ................ C23C 28/042
424/423

(Continued)

FOREIGN PATENT DOCUMENTS

| JP | 2005-161431 A | 6/2005 |
|----|---------------|--------|
| JP | 2007-162613 A | 6/2007 |

(Continued)

OTHER PUBLICATIONS

International Preliminary Report on Patentability in corresponding International Application No. PCT/JP2017/030096, dated Feb. 26, 2019 (7 pages).

(Continued)

*Primary Examiner* — Archene A Turner
(74) *Attorney, Agent, or Firm* — Osha Bergman Watanabe & Burton LLP

(57) ABSTRACT

A multilayer structure includes: a base material made of an iron-based metal material; a nitride layer that is provided on a surface of the base material through a nitriding treatment performed to the base material; an intermediate layer provided on a surface of the nitride layer; and a DLC layer provided on a surface of the intermediate layer. The inter- (Continued)

mediate layer is made of $Si_3N_4$, and the DLC layer has a thickness of 2 μm to 10 μm.

16 Claims, 6 Drawing Sheets

(51) Int. Cl.
    *F04C 15/00*     (2006.01)
    *F01D 25/00*     (2006.01)
    *C23C 28/04*     (2006.01)
    *C23C 8/38*     (2006.01)
    *C23C 8/80*     (2006.01)
    *C23C 16/02*     (2006.01)
    *C23C 16/27*     (2006.01)

(52) U.S. Cl.
    CPC ............ *C23C 16/27* (2013.01); *C23C 28/042* (2013.01); *C23C 28/046* (2013.01); *F01D 5/28* (2013.01); *F01D 25/00* (2013.01); *F04C 15/00* (2013.01)

(58) Field of Classification Search
    USPC .................. 428/332, 336, 408, 457, 698
    See application file for complete search history.

(56) References Cited

U.S. PATENT DOCUMENTS

| | | |
|---|---|---|
| 2010/0247885 A1 | 9/2010 | Ito et al. |
| 2010/0314005 A1* | 12/2010 | Saito .................. C23C 14/0605 428/457 |
| 2011/0135946 A1 | 6/2011 | Konno et al. |
| 2015/0004362 A1 | 1/2015 | Krishna et al. |

FOREIGN PATENT DOCUMENTS

| | | |
|---|---|---|
| JP | 2010-037613 A | 2/2010 |
| JP | 2010-121846 A | 6/2010 |
| JP | 2010-222655 A | 10/2010 |
| JP | 2011-074797 A | 4/2011 |
| JP | 2012-224925 A | 11/2012 |
| JP | 2015-10278 A | 1/2015 |

OTHER PUBLICATIONS

International Preliminary Report on Patentability in corresponding International Application No. PCT/JP2017/030096 dated Feb. 26, 2019 (12 pages).

* cited by examiner

| Layer Structure | | | Examples | | | | Comparative Examples | | | |
|---|---|---|---|---|---|---|---|---|---|---|
| | | | 1 | 2 | 3 | 4 | 1 | 2 | 3 | 4 |
| Base Material | | | SUS410 J1 | | | | SUS410 J1 | | | |
| Nitride Layer | Formation Method | | R | R | I | R | / | / | R | I |
| | Thickness(μm) | | 60 | 70 | 30 | 60 | / | / | 60 | 30 |
| | Hardness(Hv) | | 1100 | 1100 | 1000 | 1100 | / | / | 1100 | 1000 |
| Intermediate Layer | Material | | SiC | SiC | SiC | Si₃N₄ | / | SiC | / | / |
| | Formation Method | | P | P | P | P | / | P | / | / |
| | Thickness(μm) | | 0.5 | 0.5 | 2 | 0.5 | / | 0.5 | / | / |
| Outermost Layer | Material | | DLC | DLC | DLC | DLC | DLC | DLC | DLC | DLC |
| | Formation Method | | P | P | P | P | P | P | P | P |
| | Thickness(μm) | | 10 | 5 | 2 | 2 | 3 | 10 | 3 | 3 |
| | Hardness(GPa) | | 16.5 | 20 | 20 | 20 | 20 | 20 | 20 | 20 |
| Peeling Load (N) | | | 38 | 30 | 33 | 35 | 13 | 9 | 22 | 26 |

I:Ion Nitriding
R:Radical Nitriding
P:Plasma Nitriding

FIG. 5

|  | Examples | | | | Comparative Examples | | |
|---|---|---|---|---|---|---|---|
|  | 5 | 6 | 7 | 8 | 5 | 6 | 7 |
| Layer Structure | Example 1 | Example 2 | Example 3 | Example 4 | Comp. Example 2 | Comp. Example 3 | Comp. Example 4 |
| Volumetric Wear Rate ($mm^3/hr$) | 0.28 | 0.25 | 0.25 | 0.3 | 0.8 | 0.6 | 0.5 |

FIG. 6

MULTILAYER STRUCTURE AND MACHINE COMPONENT HAVING MULTILAYER STRUCTURE

TECHNICAL FIELD

The present invention relates to a multilayer structure and a machine component having the multilayer structure.

BACKGROUND ART

A rotating component including a blade used in a rotary machine, e.g. a steam turbine, a compressor pump, and the like, is conventionally subjected to a surface treatment considering heat resistance and corrosion resistance. The steam turbine is driven when steam as working fluid is injected to a rotor blade of the turbine, and the rotary machine components such as steam turbine blades and a rotor as the rotor blade come into direct contact with the steam. Further, in the compressor pump which is used at a chemical plant and serves as a compressor that compresses various kinds of fluid, an impeller powered from outside rotates and compresses the fluid. Also in such a compressor pump, the rotary machine components such as the impeller and the rotor come into direct contact with gas.

In this case, in a component with which water droplets (drain) contained in the gas collide at high speed, for example, in the blade of the steam turbine and the impeller of the compressor pump, erosion wear occurs on its surface due to the colliding water droplets. When this type of erosion wear occurs, the component vibrates, and the component may be damaged by this vibration.

In addition, in the component used in the rotary machine as described above, a phenomenon so-called fouling in which a ceramic component contained in the gas, for example, $SiO_2$ is attached, may occur. When the ceramic component is attached to the component as described above, operating efficiency is deteriorated, which deteriorates entire efficiency of the apparatus.

As a measure to prevent erosion wear and fouling, formation of a film on a surface of a base material has been widely examined. Under such circumstances, a film using a DLC (Diamond-Like Carbon) film has been proposed.

For example, Patent Literature 1 proposes that, in a rotary machine including a surface smoothing film at its part coming into direct contact with gas, the surface smoothing film is formed by a DLC layer as a carbon layer whose maximum height Ry of surface roughness does not exceed 1.0 μm. Patent Literature 1 also proposes that a hard nitride layer made of, for example, chromium nitride (CrN) is formed on a surface of a base material, and the surface smoothing film is formed on a surface of the hard nitride layer.

Further, Patent Literature 2 and Patent Literature 3 each proposes that a hard film made of TiN, TiAlN, etc. and a fouling prevention film made of a fluorine-containing DLC film are stacked in order on the surface of the base material.

Furthermore, Patent Literature 4 proposes formation of a multilayer coating that includes adhesive base layers to be bonded to a metal base material, and an upper surface layer having surface roughness Ra equal to or less than about 0.0254 μm, and in which at least one of the adhesive base layers is made of diamond-like carbon.

CITATION LIST

Patent Literature

Patent Literature 1: JP 2007-162613 A
Patent Literature 2: JP 2010-37613 A
Patent Literature 3: JP 2011-74797 A
Patent Literature 4: JP 2015-10278 A

SUMMARY OF INVENTION

Technical Problem

According to examinations by the inventors, however, the following results are obtained.

First, in Patent Literature 1, adhesiveness between the DLC film and the hard nitride layer is insufficient. Also in Patent Literature 2 and Patent Literature 3, adhesiveness between the fluorine-containing DLC film and the hard film is insufficient.

Further, in Patent Literature 4, if the drain collides with the DLC layer as the uppermost layer, the impact may be applied also to the base material to generate a minute dent on the base material. And then, there is a possibility that the DLC layer cannot follow the dent. This may cause crack of the DLC layer. If the crack occurs, the DLC layer is peeled.

Accordingly, an object of the present invention is to provide a multilayer structure that makes it possible to improve adhesiveness of the DLC layer and to secure erosion resistance and fouling resistance. Further, an object of the present invention is to provide a rotary machine component having such a multilayer structure.

Solution to Problem

A multilayer structure according to one aspect of the present invention includes a base material made of an iron-based metal material, a nitride layer that is provided on a surface of the base material through a nitriding treatment performed to the base material, an intermediate layer provided on a surface of the nitride layer, and a DLC layer provided on a surface of the intermediate layer.

In the multilayer structure according to one aspect of the present invention, the nitride layer has hardness that is preferably intermediate between the base material and the DLC layer, and is preferably continuously increased from the base material toward the DLC layer.

In the multilayer structure according to one aspect to the present invention, the nitride layer preferably has a thickness of 10 μm to 100 μm. In addition, in the multilayer structure according to one aspect of the present invention, the nitride layer more preferably has a thickness of 25 μm to 80 μm.

In the multilayer structure according to one aspect of the present invention, a diffusion layer in which nitrogen is diffused in the base material is preferably provided at an interface between the nitride layer and the base material.

In the multilayer structure according to one aspect of the present invention, the intermediate layer preferably has a thickness of 0.5 μm to 2 μm.

In the multilayer structure according to one aspect of the present invention, the intermediate layer preferably is made of one or two of SiC and $Si_3N_4$.

In the multilayer structure according to one aspect of the present invention, the intermediate layer may be harder than the nitride layer and/or the DLC layer.

In the multilayer structure according to one aspect of the present invention, the DLC layer preferably has a thickness of 1 μm to 10 μm.

The multilayer structure according to one of aspect the present invention descried above is preferably applied to a rotary machine component, and in particular, is preferably applied to a component of a steam turbine or a compressor.

Advantageous Effects of Invention

The multilayer structure according to the present invention includes the nitride layer that is provided on the surface of the base material through a nitriding treatment performed to the base material, the intermediate layer on the nitride layer, and the DLC layer on the intermediate layer. In the multilayer structure according to the present invention, the nitride layer and the intermediate layer are interposed, thereby buffering internal stress applied to the DLC layer. Accordingly, even if the drain collides with the DLC layer and an impact is applied to the DLC layer, peeling and crack hardly occur on the DLC layer, which makes it possible to realize the multilayer structure excellent in adhesiveness. Further, the DLC layer includes erosion resistance and sufficient fouling resistance because surface energy of the DLC layer itself is small. In other words, adopting the multilayer structure according to the present invention makes it possible to provide a rotary machine component that is excellent in adhesiveness and achieves both of erosion resistance and fouling resistance.

BRIEF DESCRIPTION OF DRAWINGS

FIG. 5 illustrates compositions and results of adhesiveness evaluation with respect to Examples 1 to 4 of the present invention and Comparative Examples 1 to 4.

FIG. 6 illustrates volumetric wear rates with respect to Examples 5 to 8 of the present invention and Comparative Examples 5 to 7.

DESCRIPTION OF EMBODIMENT

An embodiment of the present invention is described below with reference to accompanying drawings.

Figure 1:
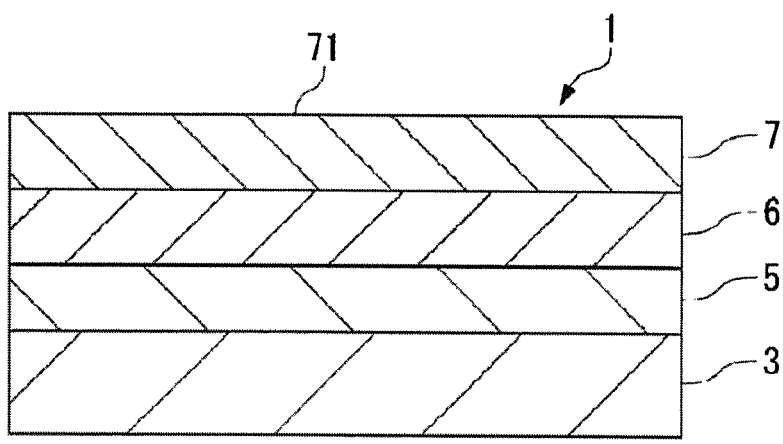
FIG. 1 is a schematic diagram of a cross-section of a multilayer structure according to an embodiment of the present invention.

As illustrated in FIG. 1, a multilayer structure 1 according to the present embodiment includes a base material 3, a nitride layer 5 provided on a surface of the base material 3, an intermediate layer 6 provided on a surface of the nitride layer 5, and a DLC layer 7 provided on a surface of the intermediate layer 6. When applied to a rotary machine described later, the multilayer structure 1 exerts erosion resistance and fouling resistance.

In the multilayer structure 1, the DLC layer 7 is stacked through the intermediate layer 6 and the nitride layer 5 that is formed through nitriding performed to the surface of the base material 3, which improves adhesiveness of the DLC layer 7.

In the following, the base material 3, the nitride layer 5, and the DLC layer 7 are described in order, and evaluation results of the multilayer structure 1 are then described.

[Base Material 3]

The base material 3 of the multilayer structure 1 is made of an iron-based metal material configuring various kinds of components of the rotary machine. Examples of the base material 3 include martensitic stainless steel represented by SUS403 and SUS410J1, austenitic stainless steel represented by SUS301 and SUS301J1, ferritic stainless steel represented by SUS430 and SUS410L, two-phase stainless steel represented by SUS329J1, and precipitation hardening stainless steel represented by SUS630. In addition, an iron-based metal material which is commonly used in the rotary machine may be used as the base material 3 without limitation.

In the case of any of the above-described stainless steel, the base material 3 substantially has Vickers hardness (Hv) of 200 to 500, which differs depends on a kind of a metal material to be used. The base material 3 in the present embodiment indicates a part excluding the nitride layer 5 provided on the surface thereof.

Note that the hardness Hv and a measurement procedure thereof, also in examples described later, conform to JIS Z 2244.

[Nitride Layer 5]

The nitride layer 5 is provided to improve adhesiveness of the DLC layer 7 described later and to buffer an impact caused by collision of drain.

The nitride layer 5 is made of a compound mainly containing a nitride of iron (Fe) that is a main component of the base material 3, and a diffusion layer in which nitrogen is diffused is provided on an interface with the base material 3.

The nitride layer 5 is interposed between the base material 3 and the DLC layer 7, and has hardness of a value intermediate between the base material 3 and the DLC layer 7, and is obtained through a nitriding treatment performed to the base material 3. Accordingly, the diffusion layer of the nitride layer 5 has hardness equivalent to the hardness of the base material 3 near the interface with the base material 3, and has high adhesiveness to the base material 3 as compared with the nitride formed on the base material 3.

The nitride layer 5 is provided to prevent the base material 3 from being locally deformed, and has the hardness intermediate between the base material 3 and the DLC layer 7. As described later, the nitride layer 5 has a gradient structure in which the hardness is continuously increased from the base material 3 toward the DLC layer 7, and specific hardness is determined based on a material of the base material 3 subjected to the nitriding treatment. For example, when the base material 3 is made of SUS410J1 and the hardness is measured from a cross-sectional direction orthogonal to a thickness direction of the nitride layer 5, the hardness is about 400 Hv to about 1200 Hv. As described later, the nitride layer 5 includes the gradient structure in which the hardness is continuously increased from the base material 3 toward the DLC layer 7, and the hardness is varied in the thickness direction.

The nitride layer 5 is formed in the thickness direction from an initial surface of the base material 3, by performing the nitriding treatment on the surface of the base material 3 by a method described later. The thickness of the nitride layer 5 is adjustable so as to be increased as illustrated by an alternate long and short dash line in FIG. 2 or so as to be decreased as illustrated by a solid line in FIG. 2, depending on a treatment time taken for the nitriding treatment and other conditions. When the thickness of the nitride layer 5 is excessively small, effects by the nitride layer 5 may not be sufficiently exerted. In contrast, when the thickness of the nitride layer 5 is larger than necessary, the effects are saturated, and the treatment time becomes longer to impair economic efficiency. Considering the above, the nitride layer 5 preferably has the thickness of 10 μm to 100 μm, more preferably 20 μm to 90 μm, and further preferably 25 μm to 80 μm.

Figure 2:
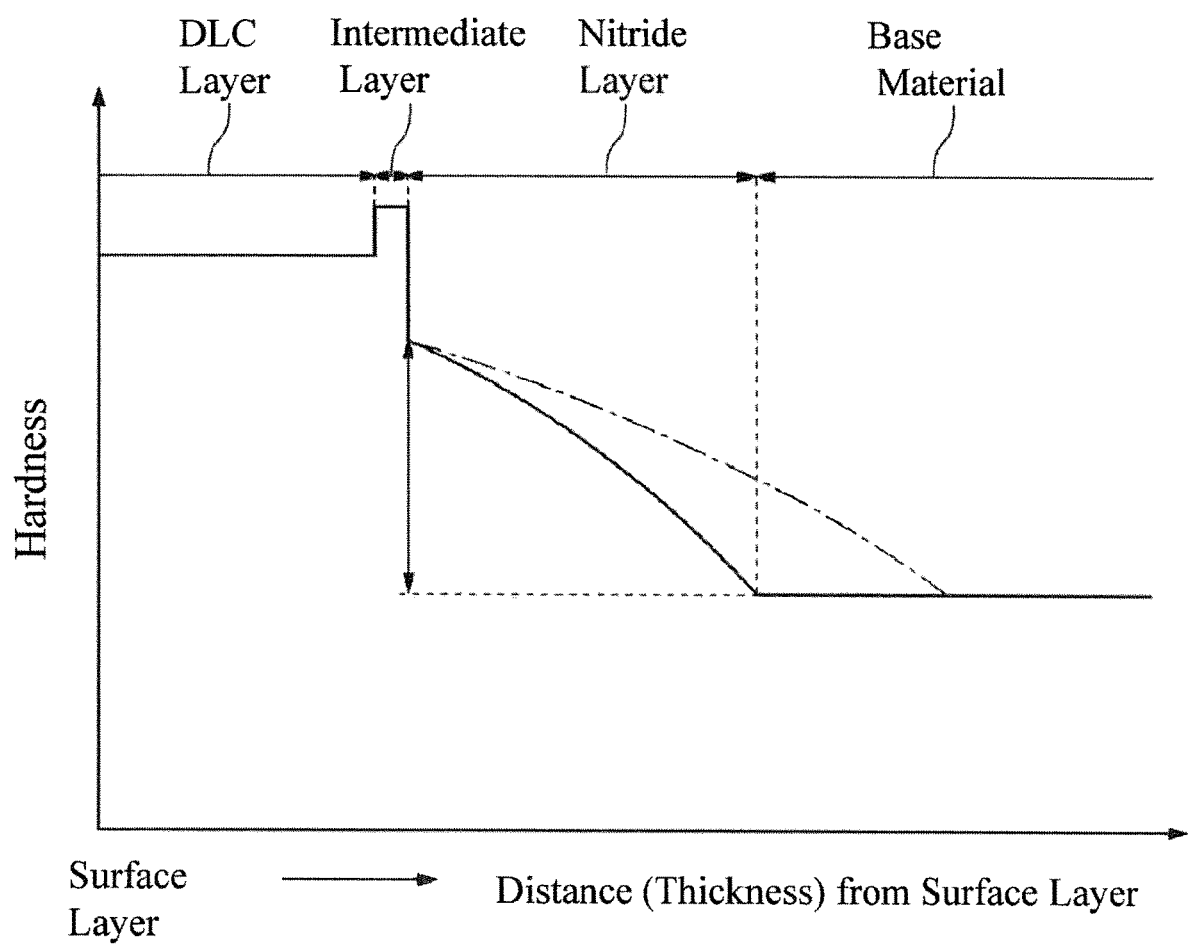
FIG. 2 is a diagram illustrating hardness distribution of the multilayer structure according to the embodiment of the present invention.

Note that the thickness of the nitride layer 5 is defined by a thickness including the above-described diffusion layer (JIS B 6905), and the thickness of the nitride layer 5 in each of examples described layer is also measured so as to include the diffusion layer. As illustrated in FIG. 2, the nitride layer 5 includes the gradient structure in which the hardness is decreased in the thickness direction from a surface 71 of the DLC layer 7 because the nitride layer 5 includes the diffusion layer.

If the DLC layer 7 is provided on the surface of the base material 3 without interposing the nitride layer 5, an impact occurred on the DLC layer 7 due to collision of drain directly transferred to the base material 3, and the base material 3 having a low hardness is locally deformed responding to the collision of the drain because of a large difference in hardness between the base material 3 and the DLC layer 7. As a result, the DLC layer 7 is also deformed, and crack and peeling easily occur on the DLC layer 7. In contrast, when the nitride layer 5 that has hardness higher than the hardness of the base material 3 is provided on the surface of the base material 3 and is interposed between the base material 3 and the DLC layer 7, even if the drain collides with the DLC layer 7, the nitride layer 5 resists the impact. As a result, the nitride layer 5 buffers the impact applied to the DLC layer 7, which allows for suppression of deformation of the base material 3. As described above, the nitride layer 5 suppresses occurrence of crack and peeling on the DLC layer 7. In other words, the nitride layer 5 improves adhesiveness of the DLC layer 7 through stress relaxation.

Further, since the nitride layer 5 has the gradient structure in which the hardness is continuously increased from the base material 3 toward the DLC layer 7, it is possible to prevent abrupt shape change due to shearing force. This allows the nitride layer 5 to suppress stress concentration, which makes it possible to prevent crack of the DLC layer 7.

[Method of Forming Nitride Layer 5]

Any method is usable to form the nitride layer 5, and a well-known nitriding treatment is adoptable. As the nitriding treatment, an ion nitriding treatment and a radical nitriding treatment are adoptable.

In the ion nitriding treatment, nitrogen and hydrogen as reaction gas are introduced into a pressure-reduced vacuum furnace, and a DC voltage of several hundred volts is applied with use of the base material 3 as a cathode and a furnace body as an anode, which causes glow discharge on the cathode side. Nitrogen ions and hydrogen ions that are accordingly positively charged collide with the base material 3 serving as the cathode. Temperature of the base material 3 is increased by the collision, and nitride is generated and diffused inside the base material 3, which forms the nitride layer 5. The thickness of the nitride layer 5 formed by a plasma nitriding treatment is adjustable by changing a treatment temperature, a bias voltage, a treatment time, and a partial pressure ratio of nitrogen gas to hydrogen gas.

The radical nitriding treatment is one of plasma nitriding methods. Mixed gas of ammonia gas and hydrogen gas is introduced into a furnace to generate glow discharge between a furnace body and the base material 3, and nitrogen ions in plasma are made to react with the metal of the base material 3, which forms the nitride layer 5 on the surface of the base material 3. The thickness of the nitride layer 5 formed by the radical nitriding treatment is adjustable by changing a treatment temperature, a bias voltage, a treatment time, and a partial pressure ratio of hydrogen gas and ammonia gas.

[Intermediate Layer 6]

The intermediate layer 6 is formed on the surface of the above-described nitride layer 5. The intermediate layer 6 is provided to improve adhesiveness of the DLC layer 7, together with the nitride layer 5.

The intermediate layer 6 includes a single layer of either SiC (silicon carbide), $Si_3N_4$ (silicon nitride), or SiCN (silicon carbonitride), or stacked layers where two or more layers of them are stacked. Among them, preferably, the intermediate layer 6 includes a single layer of either SiC or $Si_3N_4$ or stacked layers of the two layers of SiC and $Si_3N_4$.

The hardness of the intermediate layer 6 depends on which one of SiC, $Si_3N_4$, or SiCN the intermediate layer 6 is made of. For example, in a case where the intermediate layer 6 is made of SiC, the hardness is about 2000 Hv to about 2200 Hv that is higher than the hardness of the nitride layer 5 as illustrated in FIG. 2. In contrast, in a case where the intermediate layer 6 is made of $Si_3N_4$, the hardness is about 1400 Hv to about 1600 Hv. Note that the hardness of the intermediate layer 6 made of SiC described above is a Vickers hardness converted from a nano-indentation hardness that is measured by a nano-indentation method (NI) with respect to a cross-sectional direction orthogonal to a thickness direction of the intermediate layer 6.

Note that the hardness of the intermediate layer 6 is measured with respect to the cross-sectional direction also in examples described later. Alternatively, in a case where the surface of the intermediate layer 6 is specified, the hardness may be measured with respect to a surface direction orthogonal to the surface of the intermediate layer 6 irrespective of whether the DLC layer 7 is stacked on the surface of the intermediate layer 6.

When the intermediate layer 6 is interposed between the nitride layer 5 and the DLC layer 7, erosion resistance of the DLC layer 7 is improved through improvement of adhesiveness of the DLC layer 7 due to presence of carbon as a constituent component of the DLC layer 7 and nitrogen as a constituent component of the nitride layer 5.

The intermediate layer 6 is made to have a desired thickness by appropriately setting conditions in the method of forming the intermediate layer 6 described later. The thickness of the intermediate layer 6 is preferably 0.5 μm to 2 μm.

[Method of Forming Intermediate Layer 6]

The intermediate layer 6 is formed by a plasma treatment continued from the ion nitriding treatment or the radical nitriding treatment.

In a case where the nitride layer 5 has been formed by the ion nitriding treatment and the intermediate layer 6 made of SiC is to be formed, first, nitrogen and hydrogen in the vacuum furnace, which were introduced in the nitriding treatment, are gradually lowered, and Si-based gas (e.g., hexamethyldisiloxane gas) and DLC raw material gas (e.g., acetylene gas) are introduced into the vacuum furnace. Thereafter, the intermediate layer 6 made of SiC is formed by performing the plasma treatment to the base material 3 on which the nitride layer 5 has been formed, in a state that the Si-based gas and the DLC raw material gas are contained in the vacuum furnace.

Further, the intermediate layer 6 made of $Si_3N_4$ is formed by performing the plasma treatment to the base material 3 on which the nitride layer 5 has been formed, the plasma treatment being performed in a state that, by introducing Si-based gas (e.g., hexamethyldisiloxane gas) into the vacuum furnace, the Si-based gas and the nitrogen introduced in the nitriding treatment are contained in the vacuum furnace.

Furthermore, the intermediate layer 6 made of SiCN is formed by performing the plasma treatment to the base material 3 on which the nitride layer 5 has been formed, the plasma treatment being performed in a state that, by introducing Si-based gas (e.g., hexamethyldisiloxane gas) and DLC raw material gas (e.g., acetylene gas) into the vacuum furnace, the Si-based gas, the DLC raw material gas, and the nitrogen introduced in the nitriding treatment are contained in the vacuum furnace.

In a case where the nitride layer 5 has been formed by the radical nitriding treatment and the intermediate layer 6 made of SiC is to be formed, first, ammonia and hydrogen gas for the nitriding treatment in the vacuum furnace are gradually lowered, and Si-based gas (e.g., hexamethyldisiloxane gas) and DLC raw material gas (e.g., acetylene gas) are introduced into the vacuum furnace. Thereafter, the intermediate layer 6 made of SiC is formed by performing the plasma treatment to the base material 3 on which the nitride layer 5 has been formed, in a state that the Si-based gas and the DLC raw material gas are contained in the vacuum furnace.

Further, the intermediate layer 6 made of $Si_3N_4$ is formed by performing the plasma treatment on the base material 3 on which the nitride layer 5 has been formed, the plasma treatment being performed in a state that by introducing Si-based gas (e.g., hexamethyldisiloxane gas) into the vacuum furnace, the Si-based gas and the ammonia gas introduced in the nitriding treatment are contained in the vacuum furnace.

Furthermore, the intermediate layer 6 made of SiCN is formed by performing the plasma treatment on the base material 3 on which the nitride layer 5 has been formed, the plasma treatment being performed in a state that by introducing Si-based gas (e.g., hexamethyldisiloxane gas) and DLC raw material gas (e.g., acetylene gas) into the vacuum furnace, the Si-based gas, the DLC raw material gas, and the ammonia gas introduced in the nitriding treatment are contained in the vacuum furnace.

[DLC Layer 7]

Next, the DLC layer 7 is described.

The DLC layer 7 is provided on the surface of the nitride layer 5, and is positioned on the outermost surface (outermost layer) of the multilayer structure 1, to provide erosion resistance and fouling resistance to the multilayer structure 1.

DLC (Diamond-Like Carbon) is an amorphous carbon film in which a crystal structure has a physical property intermediate between hexagonal graphite and cubic diamond, and is a hard film having Vickers hardness (Hv) within a range from 1000 to 5000. The main reason why the DLC has such a hardness range is difference of the constituent elements of the DLC. In other words, the DLC is largely classified into DLC including carbon and hydrogen as constituent elements and DLC including only carbon, depending on a method of forming a film of the DLC. Further, among the hydrogen-containing DLC, the hardness and other properties of the DLC are different from one another depending on a hydrogen content. The DLC layer is typically controllable so as to increase the hardness by reducing the hydrogen content.

The DLC layer 7 according to the present embodiment has a tendency to be inferior in erosion resistance when the hardness is low and also when the hardness is high.

The hardness of the DLC layer 7 can be specified by nano-indentation which is applied to hardness measurement of a thin film. This is because, as illustrated in examples described later, nano-indentation hardness is effective to evaluate erosion resistance. More specifically, in a case where the hardness is measured with respect to the surface direction orthogonal to the surface of the DLC layer 7, the nano-indentation hardness of the DLC layer 7 is preferably 13 GPa to 30 GPa, more preferably 14 GPa to 27 GPa, and furthermore preferably 15 GPa to 25 GPa.

Note that the hardness of the DLC layer 7 is measured with respect to the surface direction also in examples described later; however, the hardness may be measured with respect to the cross-sectional direction orthogonal to the thickness direction of the DLC layer 7.

The thickness of the DLC layer 7 is settable in consideration of a replacement period of a rotary machine component including the multilayer structure 1 described later. The thickness is preferably 1 μm to 10 μm, more preferably 1 μm to 8 μm, and furthermore preferably 2 μm to 5 μm.

[Method of Forming DLC Layer 7]

Any method is usable to form the DLC layer 7 and an already-known DLC film forming method is adoptable, as long as the desired DLC layer 7 is formable.

The method of forming the DLC film is largely classified into two kinds of a PVD method (Physical Vapor Deposition) in which the film is formed from solid carbon by sputtering or cathode arc discharge, and a CVD method (Chemical Vapor Deposition). Further, the CVD method includes, for example, a thermal CVD method in which a component element is gasified in a molecular state to form a film by chemical reaction, and a plasma CVD method in which hydrocarbon gas such as methane ($CH_4$) and acetylene ($C_2H_2$) is made into plasma to form a film. The plasma CVD method is advantageously lowered in a treatment temperature as compared with the thermal CVD method.

The DLC layer 7 according to the present embodiment is formable by either the PVD method or the CVD method; however, the DLC layer 7 is preferably formed by the CVD method rather than the PVD method depending on a rotary machine component which the layers are applied to. In other words, the plasma CVD method provides a good throwing power even for a narrow space, and is particularly suitable to form a film on a component including a narrow space, for example, a diaphragm of a compressor, a component inside a closed impeller, and a partition plate of a steam turbine.

At this time, as a method of generating plasma, ECR (Electron Cyclotron Resonance) plasma, and MVP (Microwave-sheath Voltage combination Plasma) in which a microwave is propagated along an inner surface to cause high-density plasma to act on the inner surface, are adoptable.

The DLC layer 7 according to the present embodiment has a property that a ceramic component is hardly adhered because of small surface energy. Therefore, the DLC layer 7 according to the present embodiment is excellent in fouling resistance even without containing fluorine.

The multilayer structure 1 according to the present embodiment provided as described above includes the base material 3, the nitride layer 5 provided on the surface of the base material 3, the intermediate layer 6 provided on the surface of the nitride layer 5, and the DLC layer 7 provided on the surface of the intermediate layer 6, and exerts erosion resistance and fouling resistance when applied to the rotary machine component described later.

The multilayer structure 1 has hardness distribution illustrated in FIG. 2. In the multilayer structure 1, the base material 3 has substantially uniform hardness in the thickness direction indicated by a lateral axis of FIG. 2, whereas the hardness of the nitride layer 5 is increased from a boundary with the base material 3 toward a boundary with the intermediate layer 6. Since the nitride layer 5 is formed through nitriding of the base material 3, the hardness has continuity at the boundary between the base material 3 and the nitride layer 5. In contrast, the intermediate layer 6 is provided on the surface of the nitride layer 5 and the DLC layer 7 is provided on the surface of the intermediate layer 6. Therefore, the hardness at the boundary between the nitride layer 5 and the intermediate layer 6 and the hardness at a boundary between the intermediate layer 6 and the DLC layer 7 are discontinuous.

The multilayer structure 1 includes, between the base material 3 and the DLC layer 7 that are considerably different in hardness from each other, the nitride layer 5 that has hardness intermediate therebetween. Accordingly, even if the drain collides and an impact occurs on the DLC layer 7, the nitride layer 5 serves as a buffer to prevent the impact from being transferred to the base material 3 or to at least reduce the impact. This suppresses local deformation of the base material 3.

In addition, the intermediate layer 6 improves the adhesiveness of the DLC layer 7, which improves erosion resistance.

The relative thickness and hardness of the nitride layer 5 and the DLC layer 7 are adjustable depending on a material of the base material 3 and a use environment of the rotary machine component to which the multilayer structure 1 is applied. Note that the thickness of the nitride layer 5 is preferably larger than the thickness of the DLC layer 7. More specifically, a ratio of the thickness of the nitride layer 5 and the thickness of the DLC layer 7 is preferably 10:1 to 100:1, more preferably 10:1 to 90:1, and especially preferably 12:1 to 40:1.

Example 1

In the following, specific examples of the present invention are described in detail. The present invention, however, is not limited to the following examples.

Multilayer structures of Examples 1 to 4 and Comparative Examples 1 to 4 described below were fabricated, and the thickness and the hardness of each of the nitride layer 5, the intermediate layer 6, and the DLC layer 7 were measured. In addition, the adhesiveness of the DLC layer 7 was evaluated (evaluation 1), and multilayer structures of Examples 5 to 8 were fabricated and drain erosion resistance was evaluated (evaluation 2).

Example 1

The radical nitriding treatment was performed on the base material 3 made of JIS SUS410J1 to form the nitride layer 5 on the surface of the base material 3. The intermediate layer 6 made of SiC was formed on the surface of the formed nitride layer 5 by the plasma CVD method. Further, the DLC layer 7 was formed on the surface of the formed intermediate layer 6 by the plasma CVD method, to manufacture the multilayer structure of Example 1. The multilayer structure 1 includes the nitride layer 5, the intermediate layer 6, and the DLC layer 7 that were stacked in order from the surface of the base material 3. The thickness and hardness of each of the formed nitride layer 5 and the formed DLC layer 7, and the thickness of the intermediate layer 6 are illustrated in FIG. 5.

Example 2

The multilayer structure of Example 2 was manufactured in a manner similar to Example 1 except that conditions to form the nitride layer 5, the intermediate layer 6, and the DLC layer 7 were changed. The thickness and hardness of each of the formed nitride layer 5 and the formed DLC layer 7, and the thickness of the intermediate layer 6 are illustrated in FIG. 5.

Example 3

The multilayer structure of Example 3 was manufactured in a manner similar to Example 2 except that the nitride layer 5 was formed by performing the ion nitriding treatment on the base material 3 same as the base material 3 in Example 2. The thickness and hardness of each of the formed nitride layer 5 and the formed DLC layer 7, and the thickness of the intermediate layer 6 are illustrated in FIG. 5.

Example 4

The multilayer structure of Example 4 was manufactured in a manner similar to Example 2 except that the intermediate layer 6 made of $Si_3N_4$ was formed, by the plasma CVD method, on the surface of the nitride layer 5 provided on a surface of the base material 3 same as the base material 3 in Example 2. The thickness and hardness of each of the formed nitride layer 5 and the formed DLC layer 7, and the thickness of the intermediate layer 6 are illustrated in FIG. 5.

Comparative Example 1

A multilayer structure of Comparative Example 1 was obtained in a manner similar to Example 1 except that the nitride layer 5 and the intermediate layer 6 were not provided. In other words, in Comparative Example 1, the DLC layer 7 was formed on the surface of the base material 3 same as the base material 3 in Example 1 by a method similar to the method in Example 1. The thickness and hardness of the formed DLC layer 7 are illustrated in FIG. 5.

Comparative Example 2

The intermediate layer 6 made of SiC was formed on the base material 3 same as the base material 3 in Example 1 by the method same as the method in Example 1. The DLC layer 7 was formed on the surface of the formed intermediate layer 6 by the method same as the method in Example 1. The thickness and hardness of the DLC layer 7 and the thickness of the intermediate layer 6 are illustrated in FIG. 5.

Comparative Example 3

The radical nitriding treatment was performed on the base material 3 same as the base material 3 in Example 1 to form the nitride layer 5 on the surface of the base material 3. The DLC layer 7 was formed on the surface of the formed nitride layer 5 by the plasma CVD method to manufacture the multilayer structure of Comparative Example 3. The thickness and hardness of each of the formed nitride layer 5 and the formed DLC layer 7 are illustrated in FIG. 5.

Comparative Example 4

The multilayer structure of Comparative Example 4 was manufactured in a manner similar to Comparative Example 3 except that the ion nitriding treatment was performed on the base material 3 same as the base material 3 in Example 1 with reducing the treatment time for the nitriding treatment to half, to form the nitride layer 5. The thickness and hardness of each of the formed nitride layer 5 and the formed DLC layer 7 are illustrated in FIG. 5.

Figure 3:
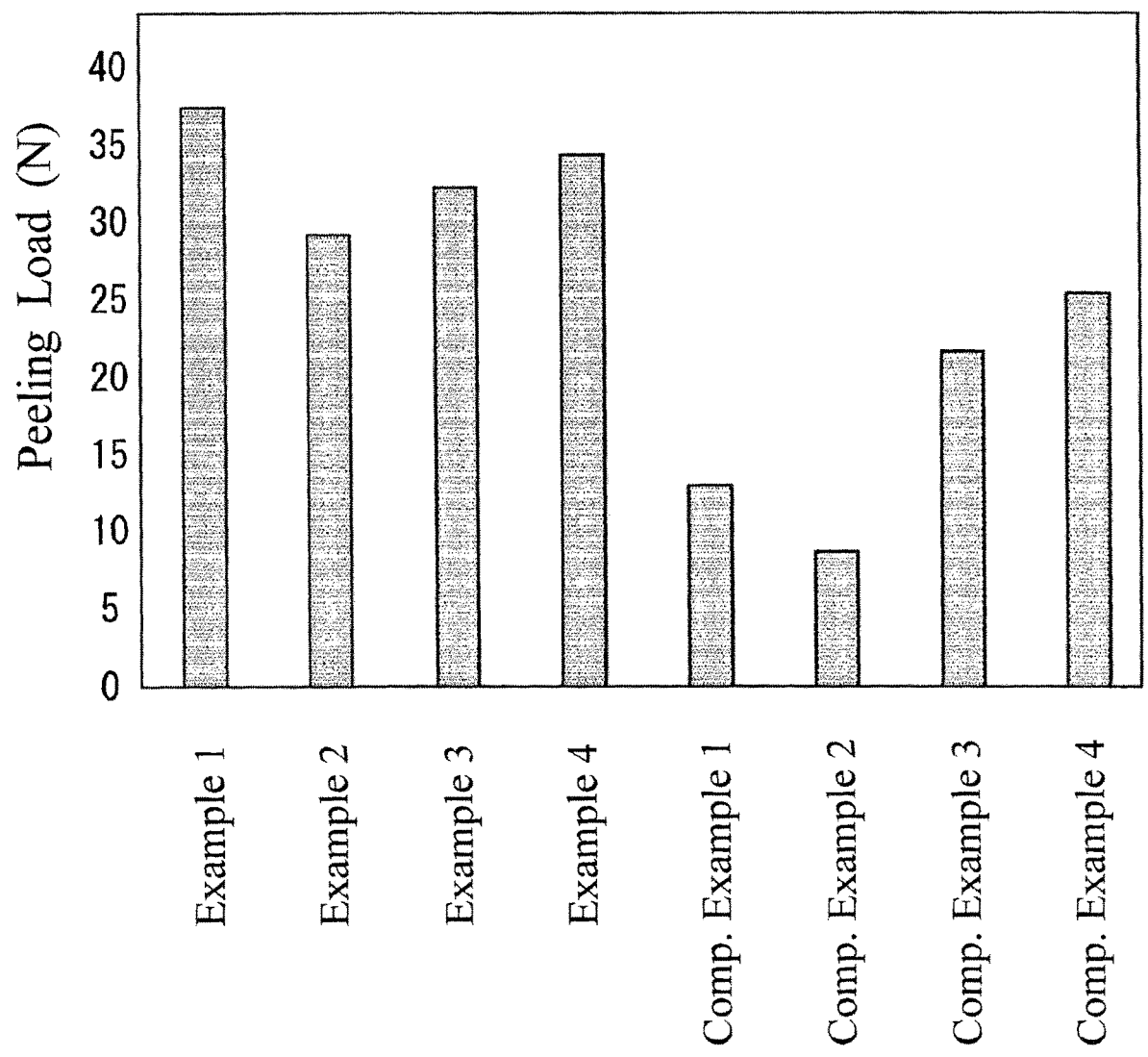
FIG. 3 is a graph illustrating results of experiments relating to adhesiveness of a DLC film.

An evaluation test described below was performed with use of the multilayer structures of Examples 1 to 4 and Comparative Examples 1 to 4. Results of the evaluation are illustrated in FIG. 3, FIG. 5, and FIG. 6.

[Evaluation 1: Adhesiveness Evaluation of Multilayer Structure]

A scratch test was performed under the following conditions, and the adhesiveness of the DLC layer 7 of the multilayer structure 1 was particularly evaluated.

More specifically, an indenter including a diamond chip at a tip thereof was pressed onto a surface of each of the fixed multilayer structures of the examples and the comparative examples, and the surface was scratched with gradually increasing an applied load, to intentionally generate chipping. Points where the chipping occurred in each of the examples and the comparative examples were read from an AE (Acoustic Emission) chart. The adhesiveness was evaluated by a peeling load (unit: N) from the results read from the AE chart. The evaluation results are illustrated in FIG. 3 and FIG. 5. The adhesiveness becomes high as the peeling load (N) is larger.

Apparatus: Automatic scratch testing machine with AE sensor (manufactured by CSM Instruments SA)
Moving speed of linear motion sample table: 10 mm/min
Loading rate: 100 N/min (=10 N/mm)

As illustrated in FIG. 3, the multilayer structure in each of Examples 1 to 4 has adhesiveness more excellent than the multilayer structure in each of Comparative Examples 1 to 4.

It is suggested, from comparison with Comparative Example 1 in which the DLC layer 7 is provided on the surface of the base material 3, and with Comparative Example 2 in which the intermediate layer 6 is provided on the surface of the base material 3 and the DLC layer 7 is provided on the surface of the intermediate layer 6, that the adhesiveness in each of Examples 1 to 4 is derived from the provided nitride layer 5. In contrast, in each of Comparative Examples 3 and 4 in which the nitride layer 5 is provided on the surface of the base material 3, the peeling load is larger than the peeling load in each of Comparative Examples 1 and 2 but is smaller than the peeling load in each of Examples 1 to 4.

As described above, providing the nitride layer 5 on the surface of the base material 3 and further providing the intermediate layer 6 on the surface of the nitride layer 5 makes it possible to achieve excellent adhesiveness, and changing the thickness and hardness of the nitride layer 5 further makes it possible to adjust the adhesiveness.

Note that the adhesiveness also contributes to improvement of erosion resistance.

[Evaluation 2: Evaluation of Drain Erosion Resistance]

To evaluate drain erosion resistance of the multilayer structure 1, the multilayer structures 1 of Examples 5 to 8 were fabricated so as to respectively have the layer structures of Examples 1 to 4, and a cavitation erosion test conforming to JIS R 1646 (ASTM G32-77) was performed. Further, the cavitation erosion test was similarly performed on the multilayer structures of Comparative Examples 5 to 7 that were fabricated so as to respectively have the layer structures of Comparative Examples 2 to 4 used in the evaluation 1. The respective evaluations of drain erosion resistance of Examples 5 to 8 and Comparative Examples 5 to 7 are illustrated in FIG. 6.

Figure 4A:
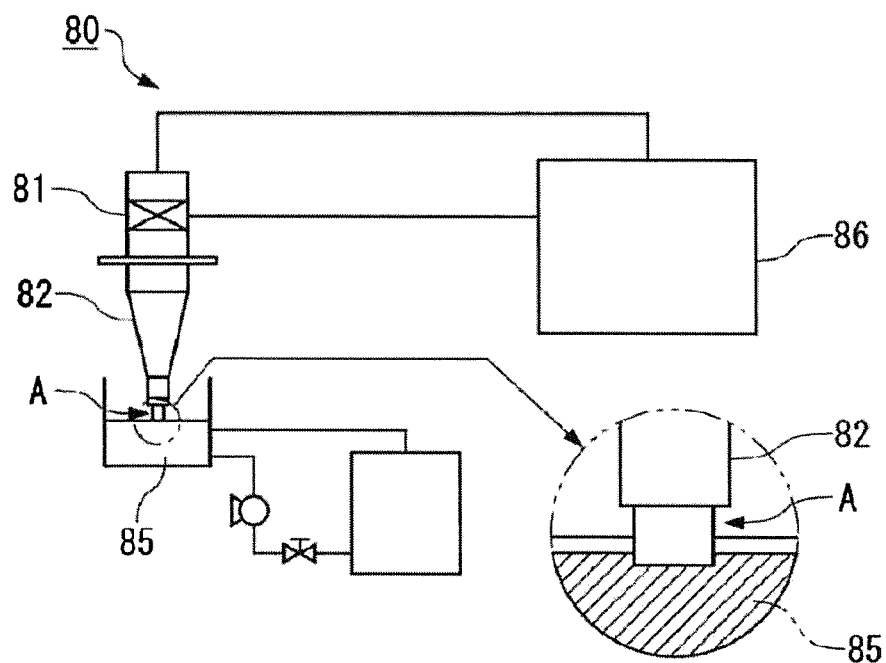
FIG. 4A is an explanatory diagram to explain a method of evaluating drain erosion resistance according to the present invention.

FIG. 4A is a configuration diagram of a cavitation erosion testing apparatus 80 used in the evaluation.

Figure 4B:
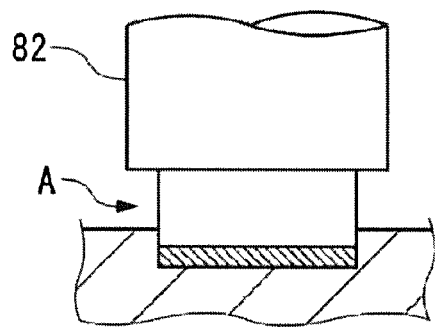
FIG. 4B is another explanatory diagram to explain a method of evaluating water-droplet erosion resistance according to the present invention.

In the evaluation, the evaluation test was performed in such a manner that a vibrator 81 was oscillated by an ultrasonic generator 86, an amplitude was enlarged by a horn 82, and a test piece A (Examples 5 to 8) attached at a tip of the horn 82 was vibrated as illustrated in FIG. 4A. As illustrated in FIG. 4B, the test piece A was fixed to the horn 82 and had a columnar shape, and the DLC layer 7 was disposed at a front end of the test piece A.

In the evaluation, the front end of the test piece A was vibrated while being immersed in a test piece solution 85, to generate air bubbles, and erosion was caused by impact pressure when the air bubbles collapsed, and liquid jet. The conditions for the test were as follows.

Frequency: 18.5 kHz
Amplitude: 25 μm
Test solution: ion-exchanged water
Immersion depth of test piece: 5 mm
Temperature of test solution: 20° C.
Test time: 2 hours After the cavitation erosion test was performed for two hours in the above-described test environment, a dry weight of each of the multilayer structures of Examples 5 to 8 was measured by an electronic balance (accuracy: 0.1 mg) to determine a weight reduction amount (erosion amount), and the drain erosion resistance was evaluated. The results thereof are illustrated in FIG. 6.

FIG. 6 illustrates volumetric wear rates (unit: $mm^3/hr$) of Examples 5 to 8 and Comparative Examples 5 to 7 respectively. FIG. 6 shows that the smaller volumetric wear rate ($mm^3/hr$) is, the higher erosion resistance is.

As illustrated in FIG. 6, the erosion resistance in Examples 5 to 8 is higher than the erosion resistance in Comparative Examples 5 to 7. Therefore, it is suggested that, by forming the base material 3, the nitride layer 5 provided on the surface of the base material 3, the intermediate layer 6 provided on the surface of the nitride layer 5, and the DLC layer 7 provided on the surface of the intermediate layer 6, it is possible to achieve high erosion resistance and high fouling resistance.

As described above, it is possible to provide the multilayer structure 1 that achieves both of the erosion resistance and the fouling resistance. Further, it is possible to adjust the adhesiveness and the erosion resistance by adjusting the thickness and the hardness of each of the DLC layer 7 and the nitride layer 5 and the thickness of the intermediate layer 6, or selecting the kind of the intermediate layer 6, depending on the kind of the rotary machine component having the multilayer structure 1 or a replacement period of the rotary machine component.

Examples of application of the multilayer structure 1 according to the present invention include a component of a rotary machine that comes into direct contact with steam, such as a blade and a rotor used in the rotary machine such as a steam turbine. Further, examples of the application of the multilayer structure 1 include a crank shaft, a synchronizer hub, a rocker arm, a rocker shaft valve, a valve guide, an impeller, a cylinder guide, a cam shaft, and the like that are machine components in fields of automobiles and aircrafts. Further, examples of the application of the multilayer structure 1 include components such as an impeller, a rotor, a piston, a valve, a high-pressure needle valve, a cylinder tube, and a cylinder rod of a compressor (compressor pump)

that compresses various kinds of fluid, used in a chemical plant or the like. Further, examples of the application of the multilayer structure 1 include common machine components such as gears including a spur gear, a helical gear, a worm and worm wheel, and the like, a shaft, a socket, and a cam. Furthermore, examples of the application of the multilayer structure 1 include various kinds of molds for die casting, plastic extruding, aluminum extruding, and the like, various kinds of tools such as a drill, a tap, and a cutter, and components of precision equipment such as a camera, a watch, and a sewing machine.

Other than the above, the configurations described in the above-described embodiment may be selected or appropriately modified without departing from the scope of the present invention.

REFERENCE SIGNS LIST

1 Multilayer structure
3 Base material
5 Nitride layer
6 Intermediate layer
7 DLC layer
71 Surface
80 Cavitation erosion testing apparatus
81 Vibrator
82 Horn
85 Test piece solution
86 Ultrasonic generator

The invention claimed is:

1. A multilayer structure, comprising:
a base material made of a ferrous metal material;
a nitride layer that is provided on a surface of the base material through a nitriding treatment performed to the base material;
an intermediate layer provided on a surface of the nitride layer; and
a DLC layer provided on a surface of the intermediate layer, wherein
the intermediate layer is made of $Si_3N_4$ and has a thickness of 0.5 micrometers ($\mu m$) to 2 $\mu m$,
the intermediate layer is harder than the DLC layer, and
the DLC layer has a thickness of 2 $\mu m$ to 10 $\mu m$.

2. The multilayer structure according to claim 1, wherein the nitride layer has hardness that is intermediate between the base material and the DLC layer, and is continuously increased from the base material toward the DLC layer.

3. The multilayer structure according to claim 2, wherein the nitride layer has a thickness of 10 $\mu m$ to 100 $\mu m$.

4. The multilayer structure according to claim 2, wherein the nitride layer has a thickness of 25 $\mu m$ to 80 $\mu m$.

5. The multilayer structure according to claim 2, wherein a diffusion layer in which nitrogen is diffused in the base material is provided at an interface between the nitride layer and the base material.

6. The multiplayer structure according to claim 2, wherein the intermediate layer includes stacked layers of a layer made of $Si_3N_4$ and a layer made of SiC.

7. The multiplayer structure according to claim 2, wherein the intermediate layer is harder than the nitride layer.

8. The multilayer structure according to claim 1, wherein the nitride layer has a thickness of 10 $\mu m$ to 100 $\mu m$.

9. The multilayer structure according to claim 1, wherein the nitride layer has a thickness of 25 $\mu m$ to 80 $\mu m$.

10. The multilayer structure according to claim 1, wherein a diffusion layer in which nitrogen is diffused in the base material is provided at an interface between the nitride layer and the base material.

11. The multilayer structure according to claim 1 includes stacked layers of a layer made of $Si_3N_4$ and a layer made of SiC.

12. The multilayer structure according to claim 1, wherein the intermediate layer is harder than the nitride layer.

13. A rotary machine component comprising a multilayer structure, the multilayer structure comprising:
a base material made of a ferrous metal material;
a nitride layer that is provided on a surface of the base material through a nitriding treatment performed to the base material;
an intermediate layer provided on a surface of the nitride layer; and
a DLC layer provided on a surface of the intermediate layer, wherein
the intermediate layer is made of $Si_3N_4$ and has a thickness of 0.5 $\mu m$ to 2 $\mu m$,
the intermediate layer is harder than the DLC layer, and
the DLC layer has a thickness of 2 $\mu m$ to 10 $\mu m$.

14. The rotary machine component according to claim 13, wherein the rotary machine component is a component of a steam turbine or a compressor.

15. A rotary machine component comprising a multilayer structure, the multilayer structure comprising:
a base material made of a ferrous metal material;
a nitride layer that is provided on a surface of the base material through a nitriding treatment performed to the base material;
an intermediate layer provided on a surface of the nitride layer; and
a DLC layer provided on a surface of the intermediate layer, wherein
the intermediate layer is made of $Si_3N_4$ and has a thickness of 0.5 $\mu m$ to 2 $\mu m$,
the intermediate layer is harder than the DLC layer,
the DLC layer has a thickness of 2 $\mu m$ to 10 $\mu m$, and
the nitride layer has hardness that is intermediate between the base material and the DLC layer and is continuously increased from the base material toward the DLC layer.

16. The rotary machine component according to claim 15, wherein the rotary machine component is a component of a steam turbine or a compressor.

* * * * *